(12) United States Patent
Makuta et al.

(10) Patent No.: US 7,852,167 B2
(45) Date of Patent: Dec. 14, 2010

(54) THIRD OVERTONE CRYSTAL OSCILLATOR

(75) Inventors: Toshikatsu Makuta, Sayama (JP);
Handong Yan, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 12/099,750

(22) Filed: Apr. 8, 2008

(65) Prior Publication Data
US 2008/0315965 A1    Dec. 25, 2008

(30) Foreign Application Priority Data
Apr. 10, 2007    (JP) .............................. 2007-102714

(51) Int. Cl.
*H03B 5/32* (2006.01)

(52) U.S. Cl. ..................... 331/158; 331/68; 331/108 D; 331/116 R

(58) Field of Classification Search ................... 331/68, 331/108 D, 116 R, 158
See application file for complete search history.

(56) References Cited

U.S. PATENT DOCUMENTS

| | | | |
|---|---|---|---|
| 6,977,557 B1 * | 12/2005 | Frerking | 331/173 |
| 2004/0085147 A1 * | 5/2004 | Harima et al. | 331/158 |
| 2004/0155715 A1 * | 8/2004 | Nakamura et al. | 331/158 |
| 2005/0212608 A1 * | 9/2005 | Kato | 331/107 A |
| 2005/0285691 A1 * | 12/2005 | Hosokawa et al. | 331/158 |

OTHER PUBLICATIONS

Seiko NPC Corporation, "CF5036 Series 2.5V LVPECL OUtput Oscillator ICs," pp. 1-10, Apr. 2004.
Seiko NPC Corporation, "CF5037 Series 2.5V LVDS Output Oscillator ICs," pp. 1-10, Apr. 2004.

* cited by examiner

*Primary Examiner*—Joseph Chang
*Assistant Examiner*—Richard Tan
(74) *Attorney, Agent, or Firm*—Knobbe Martens Olson & Bear LLP

(57) ABSTRACT

A third overtone crystal oscillator has an oscillator IC and a crystal element accommodated in a container. The IC includes transistor grounded at its emitter, a first capacitor connected to the base of the transistor via a DC blocking capacitor and to the ground potential, and a second capacitor connected between the collector of the transistor and the ground potential. Both ends of the crystal element are connected to non-grounded ends of the first and second capacitors, respectively. A spiral inductor forming a parallel resonant circuit together with the first capacitor, is provided at the container, using a printing process, for example, being independent of the IC. The parallel resonant frequency of the parallel resonant circuit is set higher than the oscillation frequency at the fundamental wave of the crystal element, and lower than the oscillation frequency at the third overtone of the crystal element.

4 Claims, 5 Drawing Sheets

PRIOR ART  FIG. 1B

THIRD OVERTONE CRYSTAL OSCILLATOR

BACKGROUND OF THE INVENTION

1. Field of the Invention

The present invention relates to a third overtone crystal oscillator, and more particularly, to a third overtone crystal oscillator which is configured by using an IC (integrated circuit) for fundamental wave oscillation of a crystal element.

2. Description of the Related Arts

Crystal oscillators configured by combining a quartz crystal element and an integrated circuit, which is provided with oscillation circuit employing the crystal element, have excellent frequency stability. The crystal oscillator are therefore used as a reference source for frequency and time in various kinds of electronic devices. One type of IC used for such crystal oscillators includes, for example, ICs which are manufactured by Seiko NPC Corporation, Tokyo, JAPAN and known by version names CF5036 series and CF5037 series. These series of ICs are used for crystal oscillators for optical digital networks.

In recent years, in order to double the transmission capacity of a network, an crystal oscillator for optical digital networks which has an oscillation output in 300-MHz band has been demanded to replace the currently used one having oscillation output in 150-MHz band.

FIG. 1A is a circuit diagram illustrating an example of a configuration of a conventional crystal oscillator, FIG. 1B is a plan view of the crystal oscillator with a cover removed therefrom, and FIG. 1C is a cross sectional view of the crystal oscillator.

The crystal oscillator includes oscillator IC 1 having an integrated oscillation circuit, and quartz crystal element (crystal blank) 2, both of which are accommodated in a recess formed in container 3. Here, it is assumed that oscillator IC 1 is one from CF5036 and CF5037 series manufactured by Seiko NPC Corporation. Such oscillator IC 1 is configured by integrating at least transistor Tr for oscillation, constant current source I, first and second capacitors C1 and C2 for oscillation, and DC (direct current) blocking capacitor Cs. Transistor Tr is grounded at the emitter thereof, with bias resistor R being connected between its collector and base.

Constant current source I is to generate a constant current by being supplied with power supply voltage Vcc, and thus supplies the constant current to a node between the collector of transistor Tr and bias resistor R. First capacitor C1 for oscillation is connected between the base of transistor Tr and the ground potential, while second capacitor C2 is connected between the collector and the ground potential. Direct-current blocking capacitor Cs is inserted between the node where the base meets with bias resistor R, and first capacitor C1. Oscillator IC 1 is provided with output terminal Vout which is connected to the collector of transistor Tr.

Container 3 is made up, for example, of laminated ceramics in which the recess is formed by stacking a frame wall layer having an opening at the center portion thereof, on bottom wall layer 3c having a substantially rectangular shape. The frame wall layer comprises of upper layer 3d, middle layer 3a and lower layer 3b. Lower layer 3b is stacked on bottom wall layer 3c, middle layer 3a is stacked on lower layer 3b, and upper layer 3d is stacked on middle layer 3a. The opening of middle layer 3a is formed smaller than the opening of upper layer 3d, and the opening of lower layer 3b is formed smaller than the opening of middle layer 3a. As a result, two levels of stepped portions are formed in the inner wall of the recess of container 3.

Oscillator IC 1 is die-bonded onto an inner bottom surface of the recess of container 3, that is, an exposed surface of bottom wall layer 3c. IC 1 is provided with a plurality of IC terminals for connection to external circuits. The IC terminals are led out by gold wires 4 for wire bonding 4 to the stepped portion formed in each of a pair of inner walls extending in the longitudinal direction of container 3. The stepped portion to which gold wires 4 are connected is the lower stepped portion among two levels of the stepped portions formed in the inner wall of the recess of container 3, the lower stepped portion thus corresponding to the upper surface of lower layer 3b. It should be appreciated that, terminals Q1 and Q2 of the IC terminals are used for establishing electrical connection with the crystal element.

Crystal element (crystal blank) 2 is an AT-cut quartz crystal blank, for example, and has excitation electrodes, not shown, on both principal surfaces. Leading electrodes extend from the excitation electrodes to the opposite side of the one end of the crystal blank. Crystal element 2 is held in the recess of container 3 by fixing, using conductive adhesive 5, the opposite sides of the one end of crystal element 2, to which the leading electrodes are extended, to the stepped portion of the inner wall in the one end portion in the longitudinal direction of container 3. The stepped portion to which crystal blank 2 is fixed corresponds to the upper stepped portion among two levels of the stepped portions formed in the recess of container 3, and is divided into two sections in a horizontal plane. Crystal holding terminals 7 used for electrical and mechanical connection with crystal blank 2 are formed on respective upper surfaces of these divided sections, with conductive adhesive 5 being coated on crystal connecting terminals 7. Crystal blank 2 is electrically connected between non-grounded ends of first and second capacitors C1, C2 via a pair of IC terminals Q1, Q2 of oscillator IC 1.

Oscillator IC 1 is secured to the bottom surface of container 3, followed by wire bonding mentioned above. Then, crystal blank 2 is secured to container 3 using conductive adhesive 5. After that, metal cover 8 is joined to an end face of the opening of the recess of container 3 to close the recess. Thus, oscillator IC 1 and crystal blank 2 are hermetically sealed in the recess to complete the crystal oscillator.

This crystal oscillator is able to change the operating frequency range of the oscillation circuit integrated in oscillator IC 1 by changing the circuit constants of the oscillation circuit. As the entire series of ICs, the available coverage of the operating frequency is approximately 50 to 700 MHz. Accordingly, a crystal oscillator having an oscillation frequency within a frequency range from 50 to 700 MHz can be obtained by electrically connecting crystal blank 2 having the vibrating frequency within this range to oscillator IC 1 (i.e., oscillation circuit).

When an IC in the above CF5036 and CF5037 series manufactured by Seiko NPC Corporation is used as oscillator IC 1, an oscillation output up to 700 MHz can be obtained in the case where the crystal element operates at the fundamental wave vibration mode. However, in the case of the third overtone oscillation, the oscillation frequency is limited up to 250 MHz. Thus, it has been impossible to obtain an oscillation output of a 300-MHz band with the third overtone oscillation.

In order to obtain an oscillation frequency in the 300-MHz band, crystal element 2 may only be operated with the fundamental wave vibration mode in the 300-MHz band in accordance with the specification of oscillator IC. However, the vibration frequency of AT-cut crystal element (crystal blank) 2 is in inverse proportion to its thickness, which means that a crystal element having a vibration frequency of 300 MHz at the fundamental wave vibration mode will have a thickness of about 5.6 µm. It is difficult to manufacture such a thin crystal element with a high yield. In this regard, if the oscillation frequency of 300 MHz can be obtained with the third overtone oscillation, a crystal element having a vibration frequency on the order of 100 MHz at the fundamental wave vibration mode may be used. Such a crystal element has a thickness of about 17 µm, can be readily manufactured, and can ensure stable supply.

SUMMARY OF THE INVENTION

An object of the present invention is to provide a crystal oscillator which enables third overtone oscillation using an oscillator IC in which an oscillation circuit for fundamental wave oscillation of a crystal element is integrated.

The object of the present invention can be achieved by a third overtone crystal oscillator comprising: a container; an oscillator IC accommodated in the container; and a crystal element accommodated in the container, wherein the oscillator IC comprises: an transistor for oscillation which is grounded at an emitter thereof and has a bias resistor connected between a collector and a base of the transistor, a constant current being supplied from a constant current source to a node between the collector and the bias resistor; a first capacitor for oscillation connected to the base via a DC blocking capacitor and to a ground potential; and a second capacitor for oscillation connected between the collector and the ground potential, wherein one end of the crystal element is connected to a non-grounded end of the first capacitor while the other end of the crystal element is connected to a non-grounded end of the second capacitor, wherein a spiral inductor consisting of a spiral line is formed at the container, the spiral inductor being separate from the oscillator IC and forming a parallel resonant circuit together with the first capacitor, and wherein a parallel resonant frequency of the parallel resonant circuit formed by the first capacitor and the spiral inductor is set higher than an oscillation frequency at a fundamental wave of the crystal element, and lower than an oscillation frequency at a third overtone of the crystal element.

With such a configuration, the impedance of the parallel resonant circuit by the first capacitor and the spiral inductor will be inductive (L) with the oscillation frequency at the fundamental wave, and will be capacitive (C) with the oscillation frequency at the third overtone. Accordingly, raising the parallel resonant frequency higher than the oscillation frequency at the fundamental wave of the crystal element, results in not obtaining negative resistance at an oscillation frequency equal to or lower than that of the fundamental wave in the oscillation circuit, whereby the oscillation at the fundamental wave can be suppressed. Also, reducing the parallel resonant frequency lower than the oscillation frequency at the third overtone, may allow the negative resistance to be obtained at an oscillation frequency equal to or higher than that of the third overtone. As a result, an oscillation output of the third overtone, which involves the highest negative resistance among frequencies higher than the parallel resonant frequency, can be readily obtained.

In addition, use of the spiral inductor formed in the container in the present invention can simplify the manufacturing processes of the crystal oscillator and can readily adjust an inductance value, comparing with the case where an inductor, which is a discrete chip part or element, is mounted on the container of the crystal oscillator at a later stage.

BRIEF DESCRIPTION OF THE DRAWINGS

FIG. 1B is a plan view of the crystal oscillator illustrated in FIG. 1A with a cover being removed;

DETAILED DESCRIPTION OF THE PREFERRED EMBODIMENT

Figure 1A:
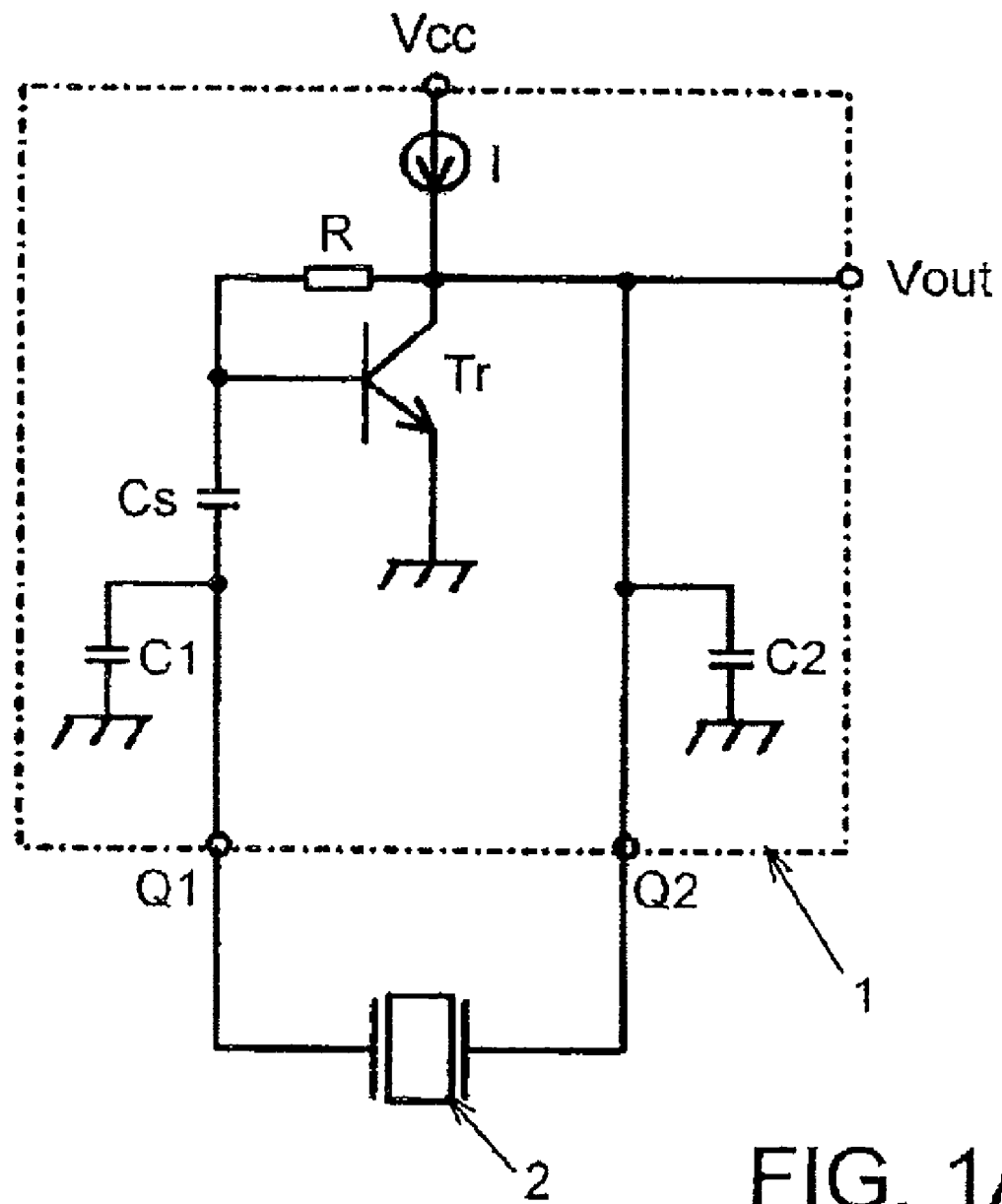
FIG. 1A is a circuit diagram illustrating a conventional crystal oscillator.
Figure 1C:
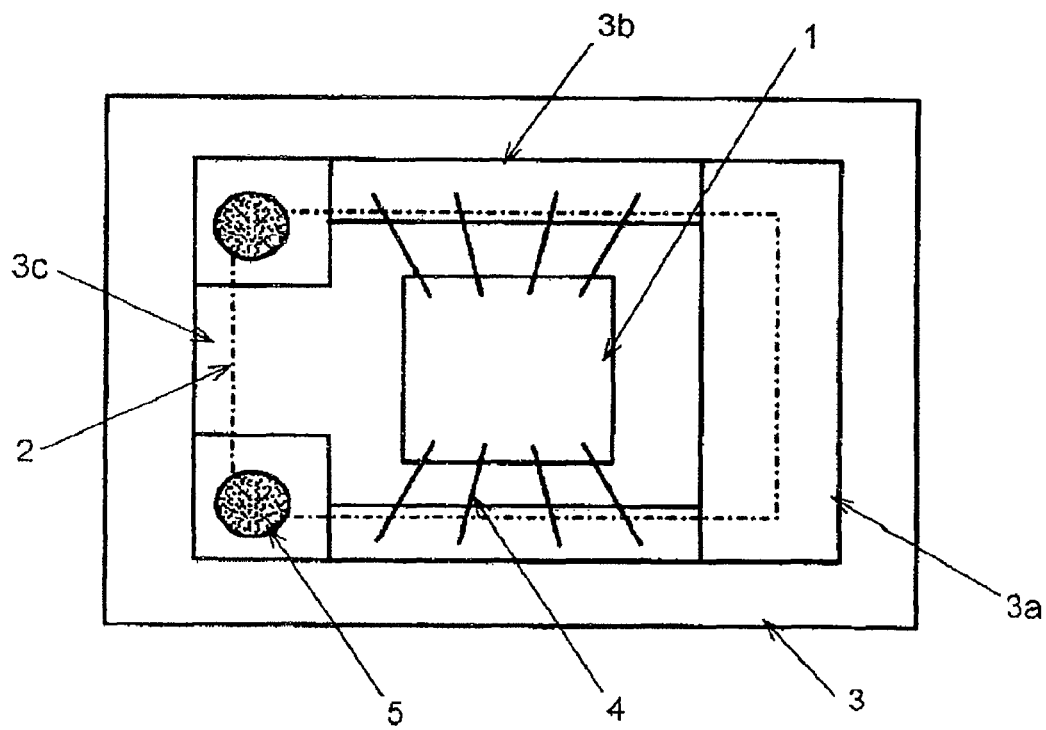
FIG. 1C is a cross sectional view of the crystal oscillator illustrated in FIG. 1A.
Figure 1C:
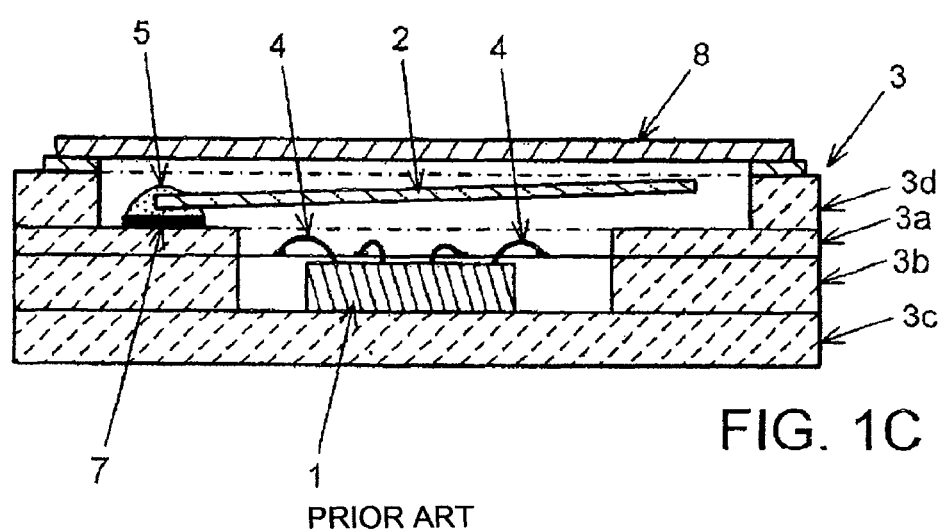
Figure 2A:
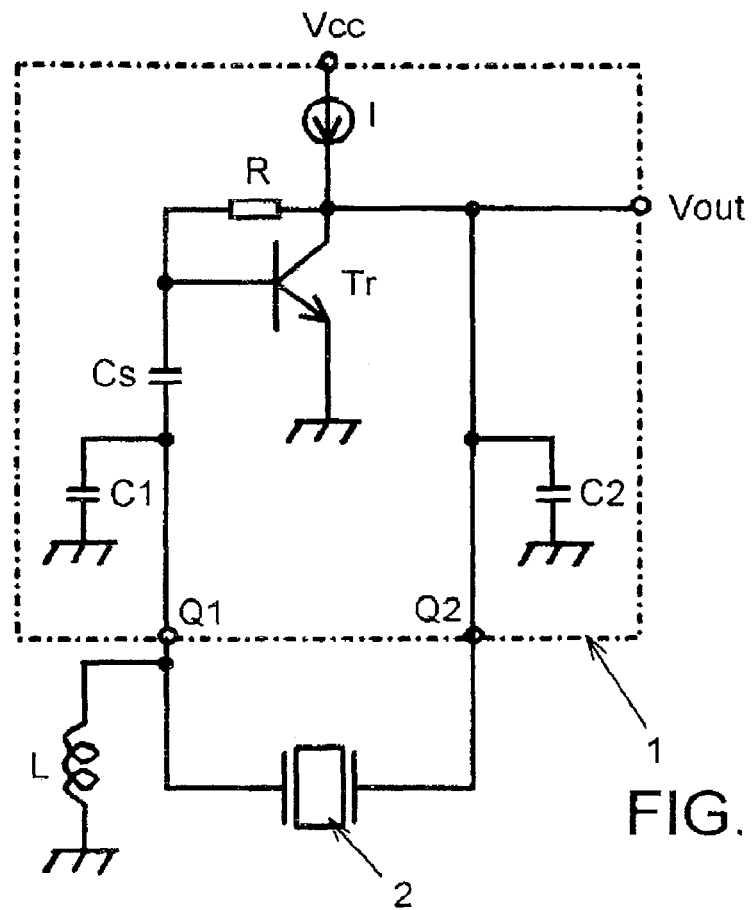
FIG. 2A is a circuit diagram of a third overtone crystal oscillator based on the principle of operation of the present invention.
Figure 2B:
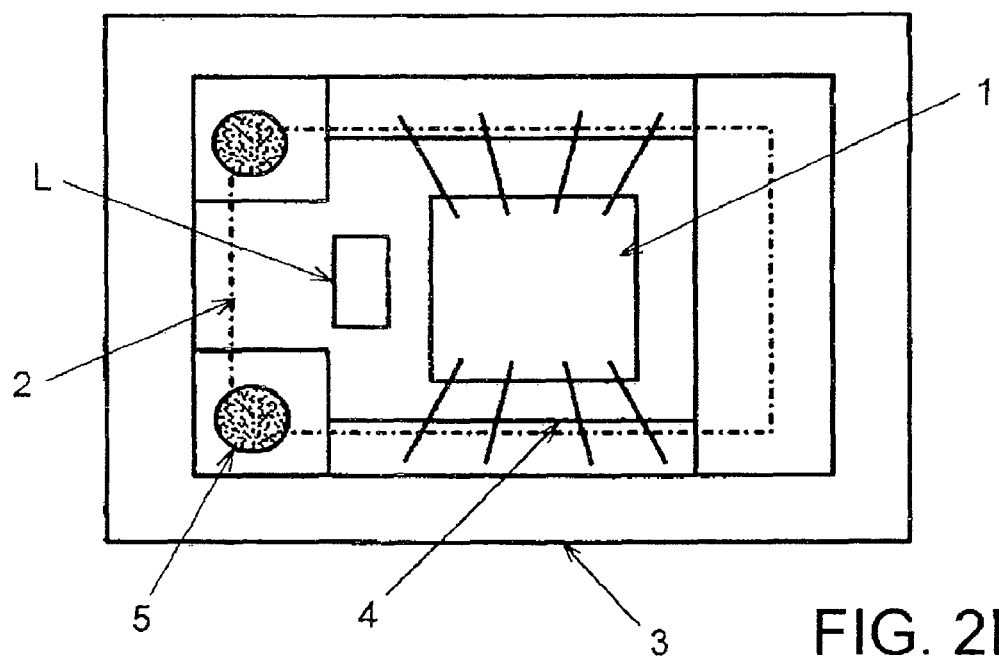
FIG. 2B is a plan view of the crystal oscillator illustrated in FIG. 2A with a cover being removed.

Hereinafter will be described, first, a crystal oscillator which is based on the principle of operation of the present invention. In FIGS. 2A and 2B illustrating a third overtone crystal oscillator based on the principle of operation of the present invention components which are the same as those in FIGS. 1A, 1B and 1C are designated with the same reference numerals, and the description on those components will be simplified or omitted.

As described above, the crystal oscillator has container 3 which accommodates therein oscillator IC 1 and quartz crystal element (quartz crystal blank) 2. Oscillator IC 1, which operates in a fundamental wave oscillation mode and has an operation frequency range, for example, of 250 to 400 MHz, is CF5036D1 manufactured by Seiko NPC Corporation. The internal equivalent circuit of oscillator IC 1 is the same as the one illustrated in FIG. 1A, and thus this IC 1 is an integration at least of transistor Tr for oscillation, constant current source I, first and second capacitors C1, C2 for oscillation, and DC blocking capacitor Cs.

Transistor Tr is grounded at the emitter thereof and has bias resistor R between the collector and the base. Constant current source I is supplied with power supply voltage Vcc to supply constant current to the node where the collector meets with bias resistor R. One end of first capacitor C1 is connected to the base via DC blocking capacitor Cs and the other end is connected to the ground potential. Second capacitor C2 is connected between the collector and the ground potential. IC terminal Q1 of oscillator IC 1 is connected to the non-grounded end of first capacitor C1, and IC terminal Q2 is connected to the non-grounded end of second capacitor C2. Both ends of crystal element (crystal blank) 2 are connected to terminals Q1, Q2, respectively.

In this crystal oscillator, inductor L is connected parallel to first capacitor C1 so that a parallel resonant circuit is formed. Inductor L is separately independent of oscillator IC 1 and, for example, is accommodated in container 3 as an inductor for a discrete chip part. Parallel resonant frequency of the parallel resonant circuit by first capacitor C1 and inductor L is set higher than oscillation frequency f1 at the fundamental wave of crystal element 2, and lower than oscillation frequency f3 at the third overtone of crystal element 2.

Figure 3:
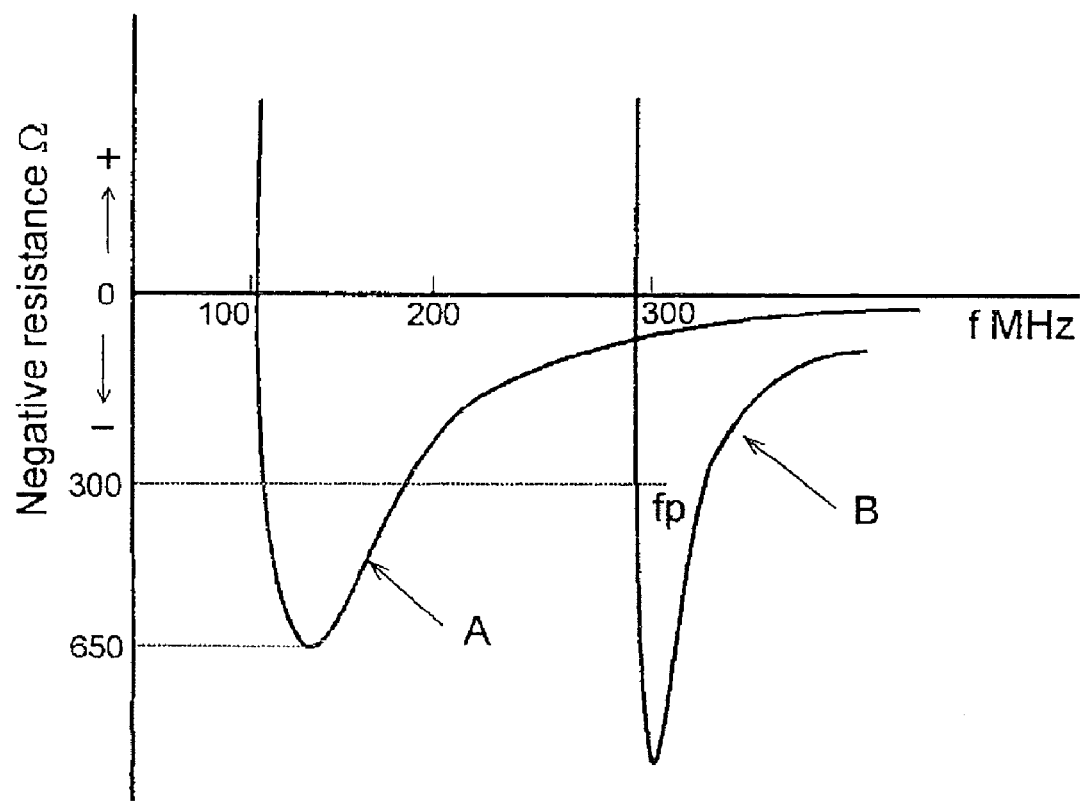
FIG. 3 is a negative resistance characteristic diagram illustrating the principle of operation of the crystal oscillator illustrated in FIG. 2A.

In such a configuration, the oscillation circuit (CF5036D1) viewed from the opposite ends of crystal element 2 has negative resistance characteristics before establishing connection with inductor L, as indicated by curve A in FIG. 3. Equivalent parallel capacitance of crystal element 2 herein is assumed to be 2 pF. Specifically, the curve has a negative resistance region where frequency is approximately 100 MHz or more with a maximum negative resistance (650Ω) residing in the vicinity of 120 MHz, and allows the negative resistance to become gradually small.

In this case, at some frequency in the 300-MHz band, such as 325 MHz, the negative resistance is about 90Ω. Accordingly, regarding the oscillation at frequency 325 MHz in the third overtone vibration mode of crystal element 2, the fundamental wave oscillation cannot be sufficiently suppressed because frequency of about 110 MHz at the fundamental wave also falls within the negative resistance region. Also, since a crystal impedance (CI) at the third overtone of crystal element 2 ranges from about 50 to 60Ω, a circuit margin provided by the negative resistance of 90Ω is too small to perform oscillation. For example, when the CI of crystal element 2 has become 90Ω or more due to aging, for example, the third overtone oscillation will be stopped. Thus, in the long run, reliability in the oscillation cannot be obtained.

On the other hand, the crystal oscillator based on the principle of operation of the present invention is connected to inductor L to form a parallel resonant circuit, by which the parallel resonant frequency is raised higher than oscillation frequency f1 (110 MHz) of the fundamental wave, as indicated by curve B of FIG. 3. In this case, negative resistance R' of the oscillation circuit side viewed from the opposite ends of crystal element 2 is expressed by the following approximation:

$$R'=R//(-Gm/(\omega^2(C1 \times C2)))$$

where Gm is transconductance of transistor Tr, ω is angular frequency, C1' is combined capacitance of the parallel resonant circuit consisting of capacitor C1 and inductor L, and R is bias resistance.

Accordingly, when parallel resonant frequency fp is set at 300 MHz, for example, the negative resistance at 300 MHz will be substantially −R, or will be a resistance having the same absolute value as that of bias resistance R but with a reversed polarity. The negative resistance turns positive at less than 300 MHz. Thus, the oscillation of crystal element 2 at fundamental wave f1 (110 MHz) can be reliably suppressed. Also, when bias resistance R is 300Ω, the negative resistance is maximized at the frequency of 300 MHz, while the negative resistance is about 200Ω at the oscillation frequency (325 MHz) in the third overtone vibration mode. Accordingly, the negative resistance (200Ω) becomes higher by a factor of three or more than the CI (50 to 60Ω) at the third overtone vibration of crystal element 2. In this way, a sufficient circuit margin is ensured, whereby reliability on the oscillation can be ensured in the long run.

Figure 4A:
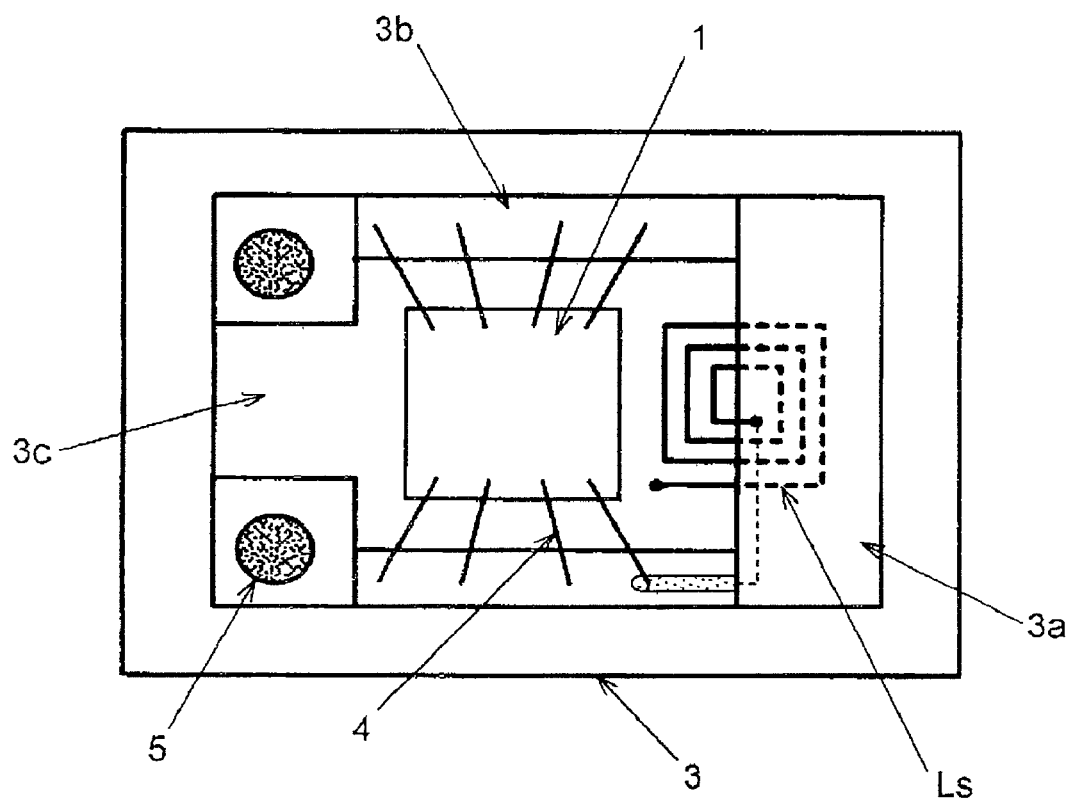
FIG. 4A is a plan view illustrating a structure of a third overtone crystal oscillator according to an embodiment of the present invention, with a cover and a crystal blank being removed.
Figure 4B:
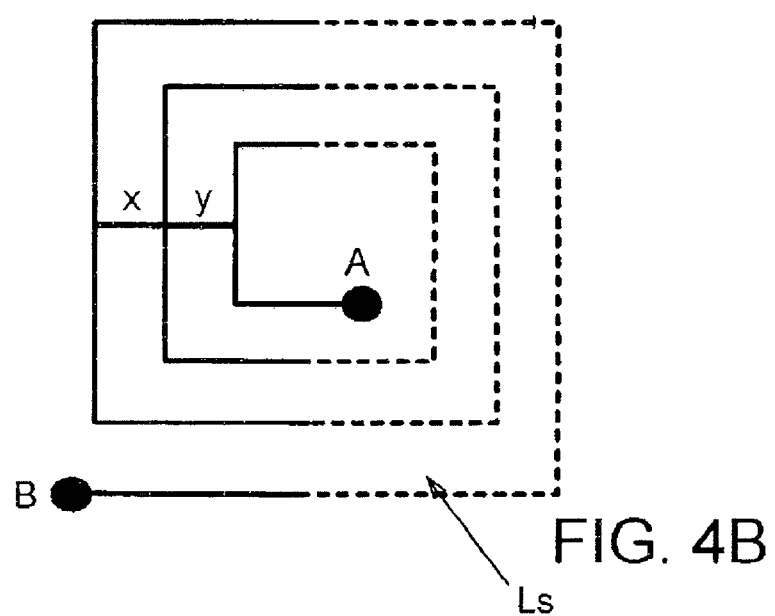
FIG. 4B is a partial enlarged plan view illustrating a spiral inductor in the crystal oscillator illustrated in FIG. 4A.

Hereinafter will be described a crystal oscillator according to an embodiment of the present invention, in light of the principle of operation of the present invention described above. In FIGS. 4A and 4B illustrating a third overtone crystal oscillator according to an embodiment of the present invention, components which are the same as those in FIGS. 2A and 2B are designated with the same references and description on those components will be simplified or omitted.

The crystal oscillator illustrated in FIGS. 4A and 4B uses spiral inductor Ls instead of inductor L of the crystal oscillator illustrated in FIGS. 2A and 2B. The spiral inductor is configured by forming a spiral line or spiral winding on a plane so that its outer periphery has a rectangular shape, and is arranged on bottom wall layer 3c of container 3. Such a spiral inductor is formed together with container 3 by laminating and burning green ceramic sheets (i.e., unburned raw ceramic sheets). Specifically, the spiral inductor is formed by spirally printing a conductive material on a green ceramic sheet before burning, which sheet corresponds to bottom wall layer 3c. In the figure, a right half, as viewed in the figure, of spiral inductor Ls is covered with the frame wall layer, and a left half, as viewed in the figure is exposed at the bottom surface of the recess of container 3. In other words, spiral inductor Ls is provided on bottom wall layer 3c so that the right half of the inductor will be located on the laminated surface of the bottom wall layer with the frame wall layer.

One of the ends of the line (i.e., winding) constituting spiral inductor Ls, which is nearer to the center of the spiral shape, is referred to as beginning end A. Beginning end A is led to the upper surface of lower layer 3b of the frame wall layer via a through hole formed in lower layer 3b, and electrically connected to IC terminal Q1 of oscillator IC 1 via an electrically conductive path formed on the upper surface of lower layer 3b and a bonding wire. Termination end B of spiral inductor Ls is electrically connected to the ground potential through a conductive pattern, not shown, which is formed on the surface of bottom wall layer 3c.

In the present embodiment, as shown in FIG. 4B, adjusting lines x, y for causing short-circuit between adjacent turns of the line (i.e., winding) are provided in the portion of spiral inductor Ls, which is exposed onto bottom wall layer 3c, in order that the inductance of spiral inductor Ls can be ensured to be adjusted. In this configuration, the inductance of spiral inductor Ls can be changed by cutting off one or both of adjusting lines x and y, as required, using laser radiation, whereby the inductance can be adjusted to have a desired value. For example, in the case where outer adjusting line x, as viewed in the figure, is cut off, the length of the line from beginning end A to termination end B is increased to also increase the number of turns, and thus the inductance will be increased. Since this causes decrease in the parallel resonant frequency by first capacitor C1 and spiral inductor Ls, a cut-off frequency point of the negative resistance is transferred to the side of low frequency. When inner adjusting line y, as viewed in the figure, is also cut off, the inductance may be further increased to further transfer the cut-off frequency point to the side of low frequency.

Such a spiral inductor Ls can be concurrently provided together with various conductive patterns and through holes that should be provided to container 3 when container 3 is formed. Therefore, comparing with the case where an inductor, which is a separately provided discrete chip part, is mounted on a container at a later stage, the present embodiment can simplify the processes of manufacturing the crystal oscillator. In addition, by forming at least a part of spiral inductor Ls on a laminated surface of the bottom wall layer with the frame wall layer, the necessity of enlarging the surface area of the recess of container 3 can be eliminated to thereby keep the size of container 3 small.

In spiral inductor Ls, the inductance can be adjusted from a smaller level to a larger level by providing the adjusting lines for causing short-circuit between the turns of the wiring and by ensuring cutting off of the adjusting lines, as required, whereby the cut-off frequency point of the negative resistance can be controlled. Alternative to providing in advance adjusting lines x, y to cut off the lines as required, spiral inductor Ls may be configured, for example, to achieve short-circuit between the adjacent turns of the wiring using a conductive adhesive, so that the inductance can be adjusted from a larger level to a smaller level.

The outer shape of spiral inductor Ls is not limited to a rectangular shape but may be a circular shape or a polygonal shape, such as a hexagonal shape.

What is claimed is:

1. A third overtone crystal oscillator comprising:
   a container;
   an oscillator IC accommodated in the container; and
   a crystal element accommodated in the container,
   wherein the oscillator IC comprises:
   a transistor for oscillation which is grounded at an emitter thereof and has a bias resistor connected between a collector and a base of the transistor, a constant current being supplied from a constant current source to a node between the collector and the bias resistor;
   a first capacitor for oscillation connected to the base via a DC blocking capacitor and to a ground potential; and
   a second capacitor for oscillation connected between the collector and the ground potential,
   wherein one end of the crystal element is connected to a non-grounded end of the first capacitor while the other end of the crystal element is connected to a non-grounded end of the second capacitor,
   wherein a spiral inductor consisting of a spiral line is formed at the container, the spiral inductor being separate from the oscillator IC and forming a parallel resonant circuit together with the first capacitor, and
   wherein a parallel resonant frequency of the parallel resonant circuit formed by the first capacitor and the spiral inductor is set higher than an oscillation frequency at a fundamental wave of the crystal element, and lower than an oscillation frequency at a third overtone of the crystal element,
   wherein the container is made up of laminated ceramics comprising a bottom wall layer and a frame wall layer having an opening portion and formed on the bottom wall layer,
   wherein the oscillator IC is secured onto an inner bottom surface of a recess constituted by the opening portion,
   wherein the spiral inductor is provided on the bottom wall layer, and
   wherein a part of the spiral inductor is formed on a laminated surface of the bottom wall layer with the frame wall layer such that the part of the spiral inductor is covered with the frame wall layer while another part of the spiral inductor is exposed at the inner bottom surface of the recess, and
   wherein an adjusting line is provided on the laminated surface at a portion where the spiral inductor is exposed at the inner bottom surface of the recess, so as to cause short-circuit between adjacent turns of winding of the spiral inductor.

2. The crystal oscillator according to claim 1, wherein an inductance value of the spiral inductor can be adjusted by cutting off the adjusting line.

3. The crystal oscillator according to claim 1, wherein the spiral inductor is formed by providing a conductive material on the bottom wall layer using a printing process.

4. The crystal oscillator according to claim 1, wherein the crystal element comprises an AT-cut crystal blank.

* * * * *